United States Patent [19]
Fujita

[11] Patent Number: 5,852,586
[45] Date of Patent: Dec. 22, 1998

[54] SINGLE-CHIP SYNCHRONOUS DYNAMIC RANDOM ACCESS MEMORY (DRAM) SYSTEM INCLUDING FIRST ADDRESS GENERATOR OPERABLE IN FIRST AND SECOND MODES

[75] Inventor: Mamoru Fujita, Tokyo, Japan

[73] Assignee: NEC Corporation, Tokyo, Japan

[21] Appl. No.: 891,193

[22] Filed: Jul. 10, 1997

[30] Foreign Application Priority Data

Jul. 22, 1996 [JP] Japan .................................. 8-192245

[51] Int. Cl.⁶ .................................................. G11C 8/00
[52] U.S. Cl. ................ 365/233; 365/230.03; 365/230.06
[58] Field of Search .............................. 365/233, 230.06, 365/230.03

[56] References Cited

U.S. PATENT DOCUMENTS

| | | | |
|---|---|---|---|
| 5,587,962 | 12/1996 | Hashimoto et al. | 365/230.09 |
| 5,594,702 | 1/1997 | Wakeman et al. | 365/230.05 |
| 5,600,606 | 2/1997 | Rao | 365/233 |
| 5,652,733 | 7/1997 | Chen et al. | 365/233 |
| 5,717,651 | 2/1998 | Kikukawa et al. | 365/233 |
| 5,751,656 | 5/1998 | Schaefer | 365/233.5 |

*Primary Examiner*—David Nelms
*Assistant Examiner*—Hien Nguyen
*Attorney, Agent, or Firm*—McGinn & Gibb, P.C.

[57] ABSTRACT

To obtain high access speed regardless of a structure and operating characteristics of an external central processing unit (CPU), a synchronous dynamic random access memory (DRAM) system includes first and second DRAM cell arrays, and a first address generator for outputting a first address and a second address respectively to the first and second DRAM cell arrays simultaneously in a first mode. In a second mode, the first address generator outputs the first address and the second address respectively to the first and second DRAM cell arrays sequentially.

20 Claims, 6 Drawing Sheets

MD2BP=1,MDBT=0,MDBL=8

| Y0 | Y1 | Y2 | Y0N1N2N | Y0T1N2N | Y0N1T2N | Y0T1T2N | Y0N1N2T | Y0T1N2T | Y0N1T2T | Y0T1T2T |
|---|---|---|---|---|---|---|---|---|---|---|
| N | N | N | 1 | 1 | 0 | 0 | 0 | 0 | 0 | 0 |
| T | N | N | 0 | 1 | 1 | 0 | 0 | 0 | 0 | 0 |
| N | T | N | 0 | 0 | 1 | 1 | 0 | 0 | 0 | 0 |
| T | T | N | 0 | 0 | 0 | 1 | 1 | 0 | 0 | 0 |
| N | N | T | 0 | 0 | 0 | 0 | 1 | 1 | 0 | 0 |
| T | N | T | 0 | 0 | 0 | 0 | 0 | 1 | 1 | 0 |
| N | T | T | 0 | 0 | 0 | 0 | 0 | 0 | 1 | 1 |
| T | T | T | 1 | 0 | 0 | 0 | 0 | 0 | 0 | 1 |

MD2BP=1,MDBT=0,MDBL=4

| Y0 | Y1 | Y2 | Y0N1N2N | Y0T1N2N | Y0N1T2N | Y0T1T2N | Y0N1N2T | Y0T1N2T | Y0N1T2T | Y0T1T2T |
|---|---|---|---|---|---|---|---|---|---|---|
| N | N | N | 1 | 1 | 0 | 0 | 0 | 0 | 0 | 0 |
| T | N | N | 0 | 1 | 1 | 0 | 0 | 0 | 0 | 0 |
| N | T | N | 0 | 0 | 1 | 1 | 0 | 0 | 0 | 0 |
| T | T | N | 1 | 0 | 0 | 1 | 1 | 0 | 0 | 0 |
| N | N | T | 0 | 0 | 0 | 0 | 1 | 1 | 0 | 0 |
| T | N | T | 0 | 0 | 0 | 0 | 0 | 1 | 1 | 0 |
| N | T | T | 0 | 0 | 0 | 0 | 0 | 0 | 1 | 1 |
| T | T | T | 0 | 0 | 0 | 0 | 1 | 0 | 0 | 1 |

MD2BP=1,MDBT=0,MDBL=2
MD2BP=1,MDBT=1,MDBL=2/4/8

| Y0 | Y1 | Y2 | Y0N1N2N | Y0T1N2N | Y0N1T2N | Y0T1T2N | Y0N1N2T | Y0T1N2T | Y0N1T2T | Y0T1T2T |
|---|---|---|---|---|---|---|---|---|---|---|
| N | N | N | 1 | 1 | 0 | 0 | 0 | 0 | 0 | 0 |
| T | N | N | 1 | 1 | 0 | 0 | 0 | 0 | 0 | 0 |
| N | T | N | 0 | 0 | 1 | 1 | 0 | 0 | 0 | 0 |
| T | T | N | 0 | 0 | 1 | 1 | 0 | 0 | 0 | 0 |
| N | N | T | 0 | 0 | 0 | 0 | 1 | 1 | 0 | 0 |
| T | N | T | 0 | 0 | 0 | 0 | 1 | 1 | 0 | 0 |
| N | T | T | 0 | 0 | 0 | 0 | 0 | 0 | 1 | 1 |
| T | T | T | 0 | 0 | 0 | 0 | 0 | 0 | 1 | 1 |

MD2BP=0,MDBT=0/1,MDBL=1/2/4/8

| Y0 | Y1 | Y2 | Y0N1N2N | Y0T1N2N | Y0N1T2N | Y0T1T2N | Y0N1N2T | Y0T1N2T | Y0N1T2T | Y0T1T2T |
|---|---|---|---|---|---|---|---|---|---|---|
| N | N | N | 1 | 0 | 0 | 0 | 0 | 0 | 0 | 0 |
| T | N | N | 0 | 1 | 0 | 0 | 0 | 0 | 0 | 0 |
| N | T | N | 0 | 0 | 1 | 0 | 0 | 0 | 0 | 0 |
| T | T | N | 0 | 0 | 0 | 1 | 0 | 0 | 0 | 0 |
| N | N | T | 0 | 0 | 0 | 0 | 1 | 0 | 0 | 0 |
| T | N | T | 0 | 0 | 0 | 0 | 0 | 1 | 0 | 0 |
| N | T | T | 0 | 0 | 0 | 0 | 0 | 0 | 1 | 0 |
| T | T | T | 0 | 0 | 0 | 0 | 0 | 0 | 0 | 1 |

FIG.3

SINGLE-CHIP SYNCHRONOUS DYNAMIC RANDOM ACCESS MEMORY (DRAM) SYSTEM INCLUDING FIRST ADDRESS GENERATOR OPERABLE IN FIRST AND SECOND MODES

BACKGROUND OF THE INVENTION

The present invention generally relates to a single-chip synchronous dynamic random access memory (DRAM) system, and more particularly to a single-chip synchronous DRAM system having a decoder for receiving a first address and for outputting a plurality of second addresses based on the first address.

DESCRIPTION OF THE RELATED ART

A general dynamic random access memory (DRAM), which is controlled by an external central processing unit (CPU), needs at least 20 ns (50 MHz) from receiving an address to outputting data, because the general DRAM performs an operation after finishing the previous operation. Therefore, a speed for accessing the DRAM cannot be increased if the general DRAM is used, although a CPU can operate (e.g., process) an instruction faster than the access speed. For solving such a problem, many devices have been developed (e.g., a cache memory, a synchronous DRAM, etc.).

The synchronous DRAM is operated with higher speed than that of the general DRAM per each data (e.g., 100 MHz or less). Specifically the synchronous DRAM processes a plurality of data simultaneously by using a so-called "burst transfer" method, although a time from receiving an address to outputting data corresponding to the address is the same as that of the general DRAM.

The burst transfer method outputs a plurality of data sequentially in synchronization with a clock signal from an external CPU, when one address is outputted from the CPU. Therefore, the synchronous DRAM need not receive each address corresponding to the plurality of data.

In this case, a length of the plurality of data is called a "burst length", and a frequency of the clock signal is called a "burst transfer frequency".

However, as mentioned above, in a reading operation, a time from receiving an address to outputting data corresponding to the address is the same as that of the general DRAM. Accordingly, a plurality of clock signals are used from receiving an address to outputting data corresponding to the address. Similarly, in a writing operation, there are a plurality of clock signals for writing data to the synchronous DRAM.

The number of clock signals needed from receiving a command for reading data to outputting data corresponding to the command is called a "column address strobe (CAS) latency". The synchronous DRAM having a mode register can change the CAS latency when the external CPU changes a content of the mode register, because sometimes the other circuits, connected to the synchronous DRAM, cannot be operated by the clock signals having the highest burst transfer frequency of the synchronous DRAM.

For the burst transfer method, a pipe-line method and a pre-fetch method are well-known. They are alternatively used for the synchronous DRAM.

The synchronous DRAM, operated by the pipe-line method, divides a series of internal operations into several stages, and sequentially processes each data in corresponding stages in response to the clock signal. In this case, each data is independently processed. The pipe-line method is preferable when the CAS latency is small (e.g., three clock signals or less).

In contrast, the synchronous DRAM, operated by the pre-fetch method, uses a plurality of buses for processing a plurality of data, and operates the same operation (e.g., reading or writing) over the plurality of buses simultaneously. Therefore, the synchronous DRAM cannot operate the other operation during the reading operation or the writing operation, until the reading operation or the writing operation are finished. The pre-fetch method is preferable when the CAS latency is large (e.g., four clock signals or more).

For example, when 2 bits are processed simultaneously (e.g., in parallel), the synchronous DRAM can receive a command from the external CPU every 2 cycles (2 clock signals) (e.g., the limitation is called a "2N rule", for j-bits (wherein j is an integer), the limitation becomes the "jN rule"), because two cycles are needed for outputting two data bits sequentially. Normally, one cycle is needed for outputting each data bit. Further, one bit data cannot be outputted from the synchronous DRAM because of the 2N rule.

Thus, by using one of the pre-fetch method and the pipe-line method, the burst transfer is accomplished.

However, as mentioned above, the conventional synchronous DRAM system is fabricated for either the pipe-line method or the pre-fetch method, not for both. Once the synchronous DRAM is fabricated for the pre-fetch method, it cannot be used for the pipe-line method and vice-versa. Thus, the method cannot be selectively employed to output just one address or just two addresses depending on the external CPU.

Additionally, the CAS latency depends on the external CPU connected to the synchronous DRAM.

Therefore, if the synchronous DRAM for the pre-fetch method is used when the CAS latency is small, an access speed of the synchronous DRAM becomes slower than that of the general DRAM. Thus, the CPU and the DRAM may not be always optimally compatible. This is a problem and results in an inefficient DRAM system.

SUMMARY OF THE INVENTION

In view of the foregoing and other problems of the conventional structure, it is therefore an object of the present invention to provide an improved single-chip synchronous dynamic random access memory (DRAM) system.

It is another object of the present invention to provide an improved decoder for receiving a first address and for outputting a plurality of second addresses.

In a first aspect, a single-chip synchronous DRAM system, according to the present invention, includes first and second DRAM cell arrays, and a first address generator for outputting a first address and a second address, respectively, to the first and second DRAM cell arrays simultaneously in a first mode, and for outputting the first address and the second address, respectively, to the first and second DRAM cell arrays sequentially in a second mode.

With the unique and unobvious structure of the present invention, the first address generator respectively outputs a first address and a second address to the first and second DRAM cell arrays simultaneously in a first mode, and outputs the first address and the second address, respectively, to the first and second DRAM cell arrays sequentially in a second mode. Therefore, a high access speed is obtained by selectively changing the mode regardless of the type of a central processing unit (CPU) used to operate the DRAM system. Specifically, the DRAM system can be used freely with any external CPU regardless of the CPU's operating clock speed, since a structure (e.g., decoder including the first address generator) is provided which is selectively changeable and compatible with all CPUs.

BRIEF DESCRIPTION OF THE DRAWINGS

The foregoing and other objects, aspects and advantages will be better understood from the following detailed description of preferred embodiments of the invention with reference to the drawings, in which:

FIG. 3 is a table for explaining operations of the circuit included in the decoder 5 shown in FIG. 1;

DETAILED DESCRIPTION OF PREFERRED EMBODIMENTS OF THE INVENTION

Figure 1:
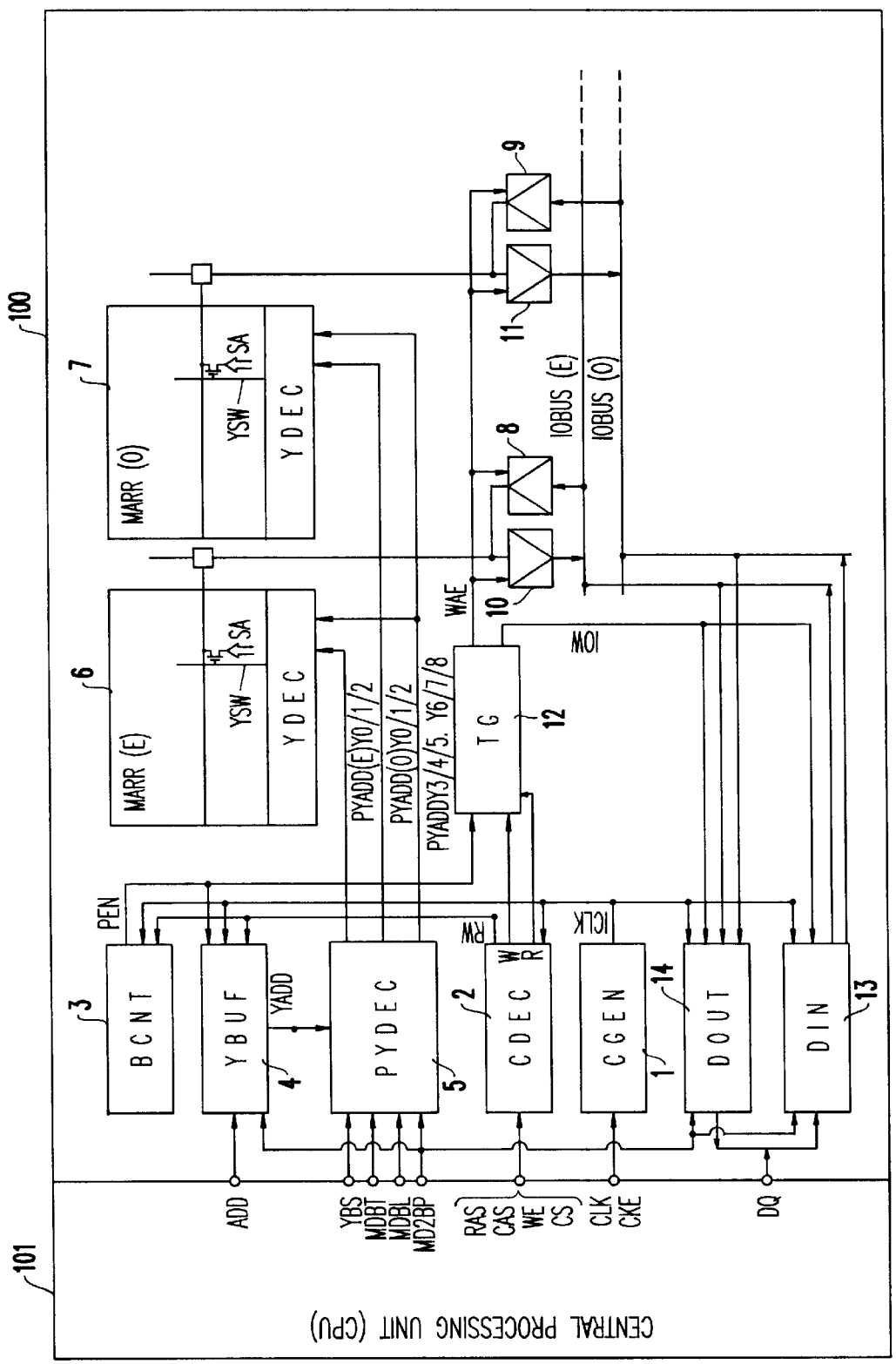
FIG. 1 illustrates a single-chip synchronous dynamic random access memory (DRAM) system according to the present invention including a decoder 5.

Referring now to the drawings, and more particularly to FIG. 1, a single-chip synchronous dynamic random access memory (DRAM) system is shown according to the present invention.

An external central processing unit (CPU) 101 is connected to a single-chip semiconductor synchronous DRAM system 100. For controlling the system 100, the external CPU outputs an address signal ADD, a pre-code activation signal YBS, a burst signal MDBT, burst length signals MDBL, a pre-fetch effective signal MD2BP, a row address strobe RAS, a column address strobe CAS, a write enable signal WE, a chip select signal CS, a clock signal CLK, and a clock enable signal CKE. Further, the external CPU outputs or inputs data DQ.

The single-chip synchronous DRAM system 100 includes an internal clock generator CGEN 1 for generating an internal clock signal ICLK, a command decoder CDEC 2 for generating a read-write signal RW, a burst counter BCNT 3 for counting the internal clock ICLK, an internal column address generator YBUF 4 for generating an internal column address YADD, a column address pre-decoder PYDEC 5 for generating a pre-decode column address PYADD, a memory cell array MARR(E) 6, a memory cell array MARR(O) 7, amplifiers 8 and 9 for a writing operation, amplifiers 10 and 11 for a reading operation, a timing signal generator TG 12 for generating a buffer control signal IOW and an amplifier activation signal WAE, an input buffer DIN 13, and an output buffer DOUT 14.

The internal clock generator CGEN 1 receives the clock signal CLK and the clock enable signal CKE, and generates the internal clock signal ICLK based on the clock signal CLK. At this time, the frequency between the clock signal CLK and the internal clock signal ICLK may be the same, but a duty ratio between them may be different, because the clock signal CLK is converted to the internal clock signal ICLK for operating the system 100 suitably. However, if the clock enable signal CKE has an inactive level (e.g., "0") when a rising edge of the clock signal CLK occurs, the internal clock generator CGEN 1 does not generate the internal clock signal ICLK.

The command decoder CDEC 2 receives command signals (e.g., RAS, CAS, WE and CS), and changes the read-write signal RW from an inactive level (e.g., "0") to an active level (e.g, "1") when the command signals have a predetermined timing, which represents a command for a writing operation or a reading operation. Further, the command decoder CDEC 2 changes a write signal W from an inactive level (e.g., "0") to an active level (e.g, "1") when the command signals indicate a command for a writing operation, and changes a read signal R from an inactive level (e.g., "0") to an active level (e.g, "1") when the command signals indicate a command for a reading operation.

The burst counter BCNT 3 receives the internal clock signal ICLK and the read-write signal. When the read-write signal RW changes from an inactive level to an active level, the burst counter BCNT 3 initializes a value (e.g., "0"). Then, the burst counter BCNT 3 counts a number of the internal clock signal ICLK. For example, the burst counter BCNT 3 is incremented (e.g., by one) whenever it receives the internal clock signal ICLK. The burst counter BCNT 3 changes a burst signal PEN to an active level (e.g., "1") from an inactive level (e.g., "0") when the read-write signal RW changes from an inactive level to an active level, and changes the burst signal PEN to an inactive level from an active level when the burst counter BCNT 3 counts a predetermined number. Therefore, the burst counter BCNT 3 keeps the burst signal PEN at an active level during the burst transfer.

The internal column address generator YBUF 4 receives the address signal ADD, the pre-fetch effective signal MD2BP, the read-write signal RW, the burst signal PEN and the internal clock signal ICLK.

When the pre-fetch effective signal MD2BP has an active level (e.g., "1"), which indicates the single-chip system 100 is operated by the pre-fetch mode, the internal column address generator YBUF 4 fetches the address signal ADD, and outputs the address signal ADD as the internal column address YADD when the read-write signal RW is changed from an inactive level (e.g., "0") to an active level (e.g., "1").

Then, while the burst signal PEN has an active level (e.g., "1"), the internal column address generator YBUF 4 increases (or decreases) the value of the fetched address signal ADD by two for generating the next internal address signal, whenever the internal column address generator YBUF 4 receives the internal clock signal ICLK twice. This exemplary operation occurs because the synchronous DRAM system 100 has a pre-fetch number of "2".

When the pre-fetch effective signal MD2BP has an inactive level (e.g., "0"), which indicates the single-chip system 100 is operated by the pipe-line mode, the internal column address generator YBUF 4 fetches the address signal ADD, and outputs the address signal ADD as the internal column address YADD when the read-write signal RW is changed from an inactive level (e.g., "0") to an active level (e.g., "1"). Then, while the burst signal PEN has an active level (e.g., "1"), the internal column address generator YBUF 4 increases (or decreases) the value of the fetched address signal ADD by one for generating the next internal address signal, whenever the internal column address generator YBUF 4 receives the internal clock signal ICLK.

The column address pre-decoder PYDEC 5 receives the pre-code activation signal YBS, the burst signal MDBT, the burst length signals MDBL, the pre-fetch effective signal MD2BP, and the internal column address YADD. The column address pre-decoder PYDEC 5 selects both the memory cell array MARR(E) 6 and the memory cell array MARR(O) 7 simultaneously when the pre-fetch effective signal MD2BP has an active level (e.g., "1"). Conversely, pre-decoder PYDEC 5 selects either the memory cell array MARR(E) 6 or the memory cell array MARR(O) 7 (in turn) when the pre-fetch effective signal MD2BP has an inactive level (e.g., "0"). The circuit of the column address pre-decoder PYDEC 5 is explained hereinbelow.

The memory cell array MARR(E) 6 and the memory cell array MARR(O) 7 each include a plurality of column selective lines YSW, decoders YDEC for selecting a corresponding selective line YSW, a plurality of DRAM cells, and a plurality of sense amplifiers SA for amplifying data of the DRAM cells. The memory cell array MARR(E) 6 includes DRAM cells corresponding to even-numbered (e.g., 0, 2, 4, 6, . . . ) column addresses among the address signals ADD. The memory cell array MARR(O) 7 includes DRAM cells corresponding to odd-numbered (e.g., 1, 3, 5, . . . ) column addresses among the address signals ADD.

The timing signal generator TG 12 receives the burst signal PEN, the read signal R, and the write signal W. When the read signal R changes from an inactive level to an active level, the timing signal generator TG 12 changes the buffer control signal IOW from an inactive level (e.g., "0") to an active level (e.g., "1") and keeps the active level. Further, the timing signal generator TG 12 changes the amplifier activation signal WAE from an inactive level (e.g., "0") to an active level (e.g., "1") and keeps the active level, while the burst signal PEN has an active level. When the write signal W changes from an inactive level to an active level, the timing signal generator TG 12 changes the buffer control signal IOW from an active level to an inactive level and keeps the inactive level, and changes the amplifier activation signal WAE from an active level to an inactive level and keeps the active level, while the burst signal PEN has an active level.

The amplifiers 8 and 9 are activated when the amplifier activation signal WAE has an inactive level, and the amplifiers 10 and 11 are activated when the amplifier activation signal WAE has an active level.

The input buffer DIN 13 is activated when the buffer control signal IOW has an inactive level, and the output buffer DOUT 14 is activated when the buffer control signal IOW has an active level. Both buffers 13, 14 have an internal serial/parallel converter (not illustrated).

When the pre-fetch effective signal MD2BP has an active level, the input buffer DIN 13 converts serial data from the external CPU 101 to parallel data by using the internal clock signal ICLK, then outputs the parallel data to buses IOBUS (E) and IOBUS(O). Similarly, when the pre-fetch effective signal MD2BP has an active level, the output buffer DIN 14 converts parallel data from the buses IOBUS(E) and IOBUS (O) to serial data by using the internal clock signal ICLK, then outputs the serial data to the external CPU 101. The serial/parallel converters are not used when the pre-fetch effective signal MD2BP has an inactive level.

Figure 2:
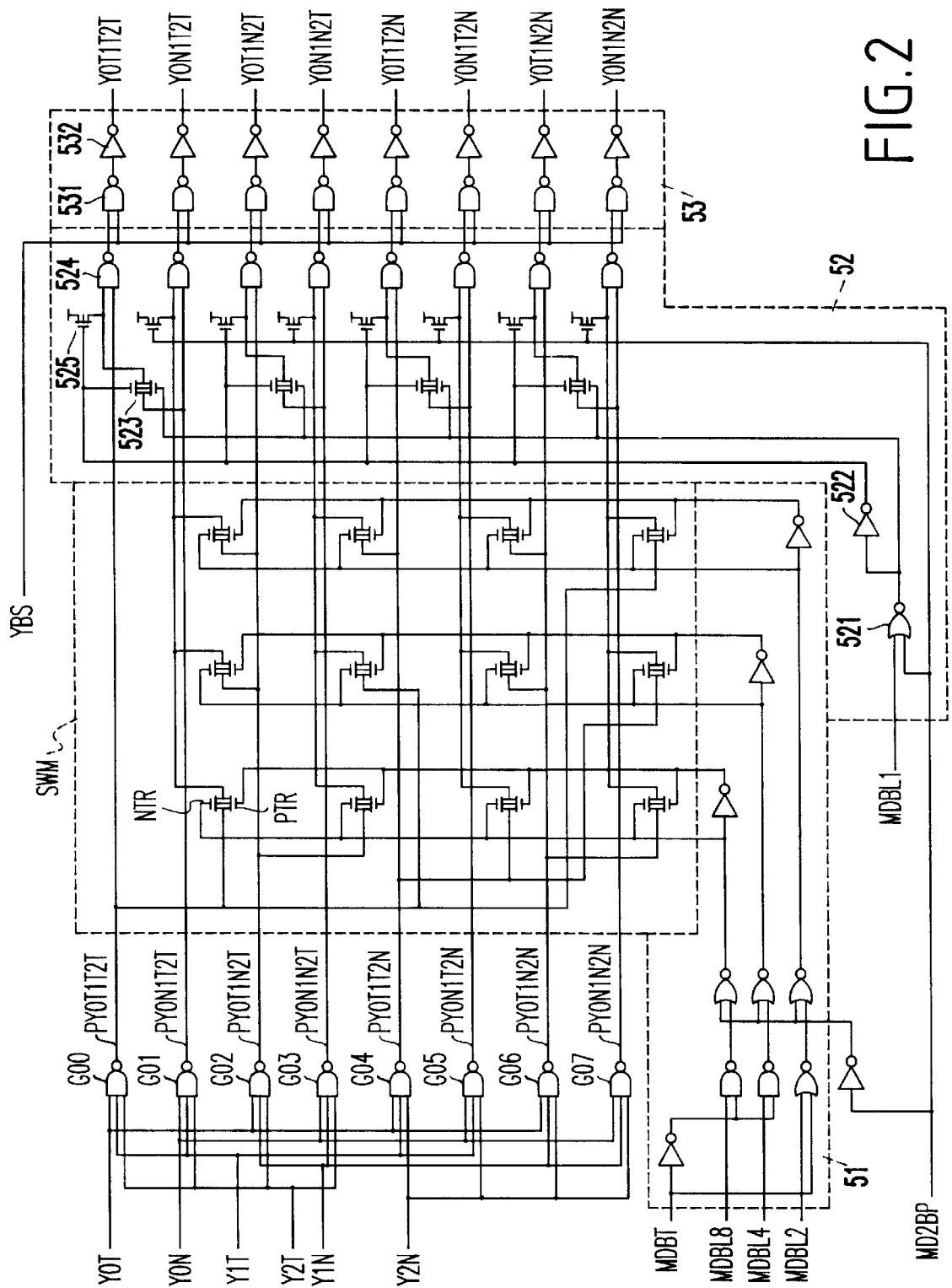
FIG. 2 illustrates a circuit included in the decoder 5 shown in FIG. 1 according to a first embodiment of the present invention.

FIG. 2 illustrates a circuit diagram included in the column address pre-decoder PYDEC 5 according to the first embodiment of the invention.

As illustrated in FIG. 2, the column address pre-decoder PYDEC 5 includes eight NAND circuits G00 to G07, a switching matrix SWM having a plurality of transfer gates, which include an N-type metal oxide semiconductor (MOS) transistor NTR and a P-type MOS transistor PTR, arranged in a matrix form, a control circuit 51 for selectively controlling the switching matrix SWM, a first selection circuit 52 for selecting corresponding outputs of the switching matrix SWM to be activated in response to a signal MDBL1 and the signal MD2BP, and a second selection circuit 53 for outputting signals corresponding to outputs of the first selection circuit 52 as eight signals Y0T1T2T to Y0N1N2.

The burst length signals MDBL include signals MDBL1, MDBL2, MDBL4 and MDBL8. The signals MDBL1, MDBL2, MDBL4 and MDBL8 respectively indicate burst lengths of 1, 2, 4 and 8 when they have an active level (e.g., "1").

A source-drain path of the MOS transistor NTR in the switching matrix SWM is connected to a source-drain path of the MOS transistor PTR.

The first selection circuit 52 has a NOR circuit 521 and an inverter 522 for generating a switching signal in response to the signal MDBL1 and the signal MD2BP, four transfer gates 523 for performing a switching operation under control of the switching signal, eight NAND circuits 524 for receiving the output signals of the NAND circuits G00 to G07 respectively at one input terminal and also for receiving the output signals of the switching matrix SWM or the output signals of the NAND circuits G01, G03, G05 and G07 at the other input terminal, and eight field-effect transistors 525 connected to junction points of output terminals of the NAND circuits 524 and transfer gates 523 and also between power supply terminals, as shown in FIG. 2.

The second selection circuit 53 has eight NAND circuits 531 for receiving the output signals of the first selection circuit 52 and the pre-code activation signal YBS, and eight inverters 532 for inverting the output signals of the NAND circuits 53 and for outputting the eight output signals Y0T1T2T to Y0N1N2N.

The signals Y0N1T2T, Y0N1N2T, Y0N1T2N and Y0N1N2N are outputted to the memory cell array MARR (E) 6, and the signals Y0T1T2T, Y0T1N2T, Y0T1T2N and Y0T1N2N are outputted to the memory cell array MARR (O) 7. The signals Y0N1T2T, Y0N1N2T, Y0N1T2N and Y0N1N2N respectively activate different selective lines YSW in the memory cell array MARR(E) 6, and the signals Y0T1T2T, Y0T1N2T, Y0T1T2N and Y0T1N2N respectively activate different selective lines YSW in the memory cell array MARR(O) 7. For example, one selective line YSW is activated when the signal Y0N1T2T has an active level (e.g., "1"), and a subsequent selective line YSW is activated when the signal Y0N1N2T has an active level (e.g., "1").

The column address pre-decoder PYDEC 5 generates complementary signals by using the lowest (e.g., Y0), first (e.g., Y1) and second (e.g., Y2) bits of the internal column address YADD. Then, complementary signals Y0T and Y0N corresponding to the lowest bit Y0, complementary signals Y1T and Y1N corresponding to the first bit Y1, complementary signals Y2T and Y2N corresponding to the second bit Y2, are outputted to the circuit shown in FIG. 2. In this case, for example, if the signal Y0T has an active level (e.g., "1" or "T"), the signal Y0N has an inactive level (e.g., "0" or "N"). If the signal Y0T has an inactive level (e.g., "0" or "N"), the signal Y0N has an active level (e.g., "1" or "T").

In this case, bits of the internal column address YADD except for the lowest, first and second bits, are outputted to the memory cell array MARR(E) 6 and the memory cell array MARR(O) 7 directly. Therefore, bits of the internal column address YADD, except for the lowest, first and second bits, are not shown in FIG. 2.

FIG. 3 is a table for explaining operations of the circuit included in the decoder 5. As shown in FIG. 3, when the pre-fetch effective signal MD2BP has an active level (e.g., "1"), one selective line YSW in the memory cell array MARR(E) 6 and one selective line YSW in the memory cell array MARR(O) 7 corresponding to the bits (Y0, Y1, Y2) in the internal address signal YADD, are activated simultaneously. Conversely, when the pre-fetch effective signal MD2BP has an inactive level (e.g., "0"), one selective line YSW in either the memory cell array MARR(E) 6 or the memory cell array MARR(O) 7 corresponding to the bits (Y0, Y1, Y2) in the internal address signal YADD, is activated alternately. Thus, changing the value of MD2BP (e.g., to "0" or to "1") adapts the DRAM to the respective mode type of the external CPU.

An exemplary reading operation is explained below referring to FIGS. 4–5.

Figure 4:
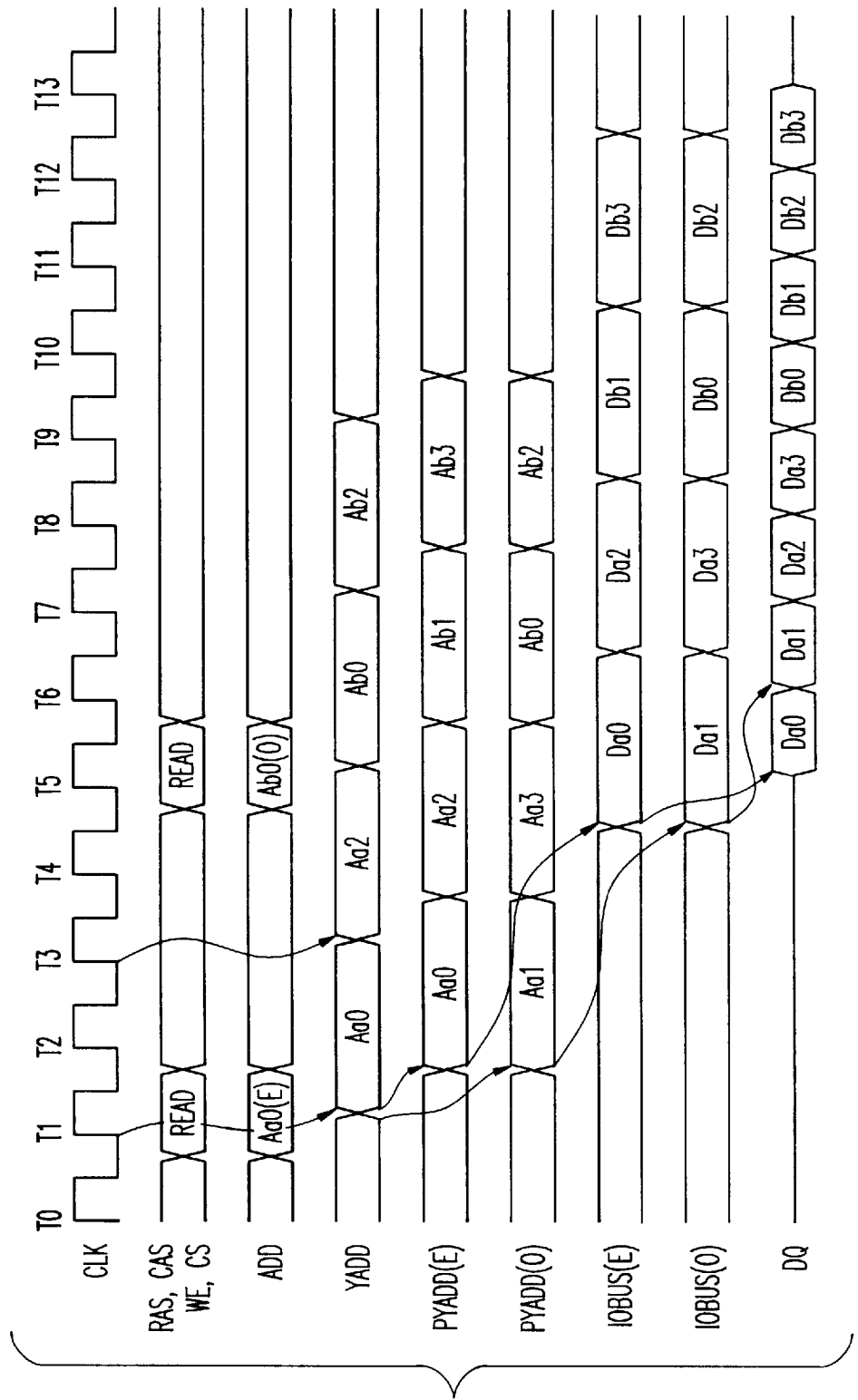
FIG. 4 is a flowchart for explaining an operation of the system shown in FIG. 1 in a pre-fetch mode.

FIG. 4 is a flowchart for explaining an operation of the system shown in FIG. 1 in a pre-fetch mode. Therefore, the external CPU 101 changes the pre-fetch effective signal MD2BP to an active level. In this case, the burst length is four.

When the single-chip synchronous DRAM system 100 receives a command for the reading operation, the internal column address generator YBUF 4 generates an address signal Aa0 corresponding to the address signal ADD, as the internal address signal YADD. Then, the column address pre-decoder PYDEC 5 outputs an even address signal Aa0 to the memory cell array MARR(E) 6, and an odd address signal Aa1 to the memory cell array MARR(O) 7 simultaneously at the timing T2.

At the timing T4, the column address pre-decoder PYDEC 5 outputs an even address signal Aa2 to the memory cell array MARR(E) 6, and an odd address signal Aa3 to the memory cell array MARR(O) 7 simultaneously, because the internal column address generator YBUF 4 increases the value of the fetched address signal ADD by two when it receives the internal clock signal ICLK twice.

Therefore, data Da0 and Da1 are outputted respectively to the buses IOBUS(E) and IOBUS(O) simultaneously at the timing T5. Then, data Da0 and Da1 are converted to serial data by the output buffer DOUT 14, and outputted to the external CPU 101.

Figure 5:
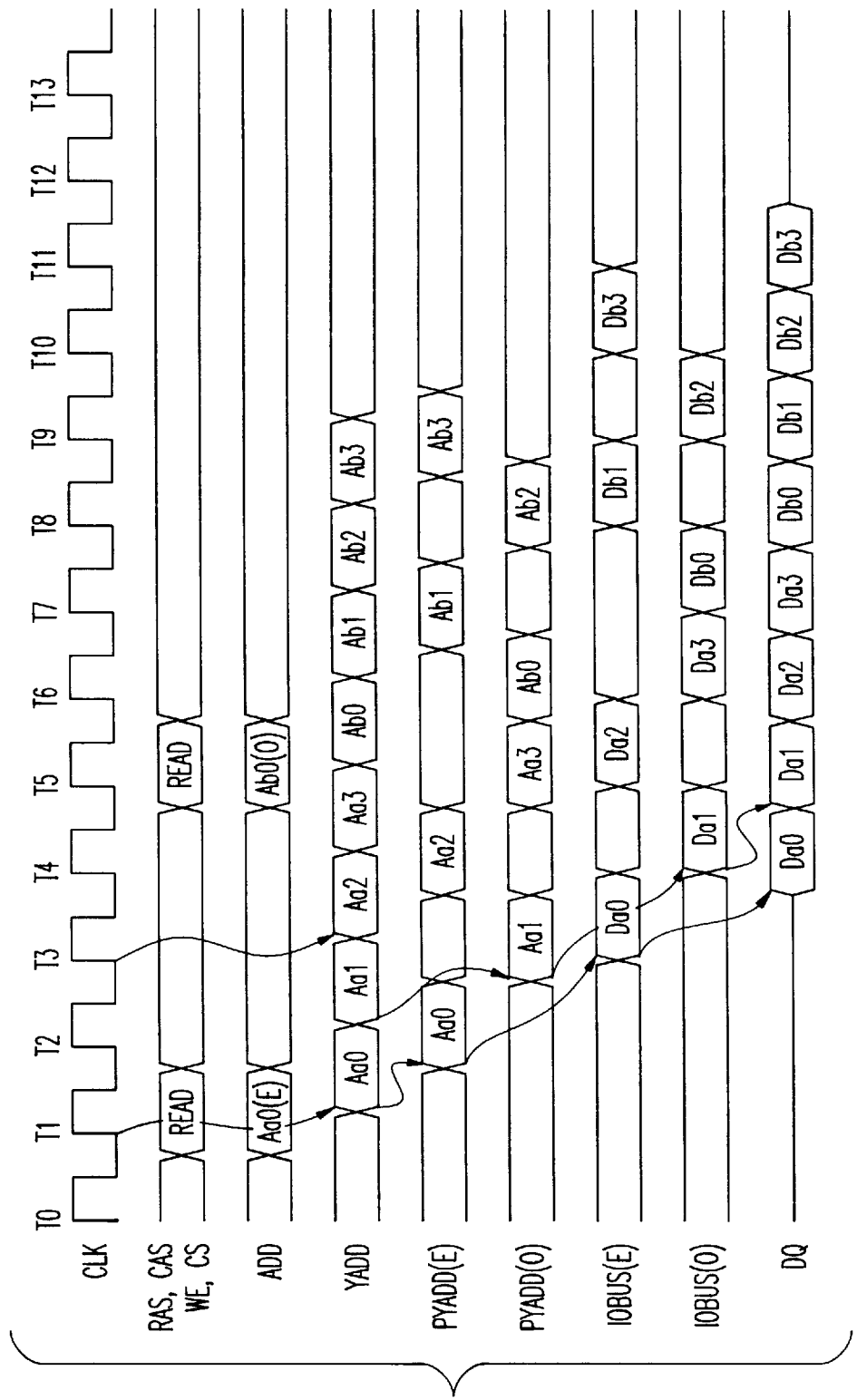
FIG. 5 is a flowchart for explaining an operation of the system shown in FIG. 1 in a pipe-line mode.

FIG. 5 is a flowchart for explaining an operation of the system shown in FIG. 1 in a pipe-line mode. Therefore, the external CPU 101 changes the pre-fetch effective signal MD2BP to an inactive level. In this case, the burst length is four.

When the single-chip synchronous DRAM system 100 receives a command for the reading operation, the internal column address generator YBUF 4 generates an address signal Aa0 corresponding to the address signal ADD, as the internal address signal YADD. Then, the column address pre-decoder PYDEC 5 outputs an even address signal Aa0 to the memory cell array MARR(E) 6. Thereafter, the column address pre-decoder PYDEC 5 outputs an odd address signal Aa1 to the memory cell array MARR(O) 7 because the internal column address generator YBUF 4 increases the value of the fetched address signal ADD by one when it receives the internal clock signal ICLK.

Therefore, the output buffer DOUT 14 receives data Da0 and Da1 sequentially, and outputs the data Da0 and Da1 to the external CPU 101 sequentially.

Although the reading operation is explained above, the writing operation is similar thereto and is easily understood by an ordinarily skilled person in the art taking the above description as a whole. Therefore, for brevity, an explanation of the writing operation is omitted.

As mentioned above, the DRAM system 100 according to the first embodiment is operated with the pre-fetch mode or the pipe-line mode in response to the capabilities and characteristics of the external CPU 101. Therefore, the DRAM system 100 is operated with the preferable mode for the external CPU 101 (and in accordance with a value of the MD2BP signal described above).

Figure 6:
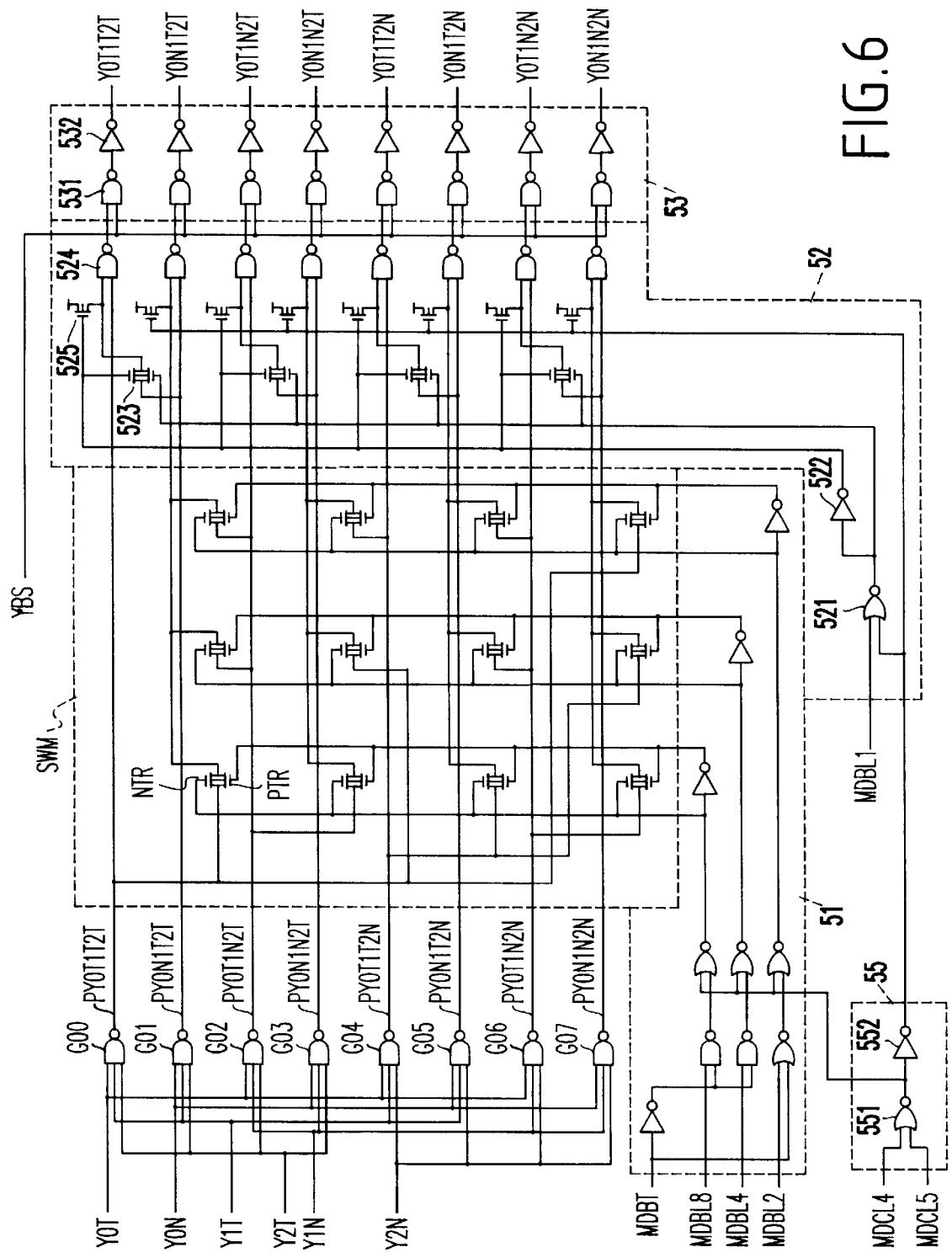
FIG. 6 illustrates a circuit included in the decoder 5 shown in FIG. 1 according to a second embodiment of the present invention.

FIG. 6 illustrates a circuit diagram included in the column address pre-decoder PYDEC 5 according to the second embodiment of the invention. The same parts in FIG. 6 as those in FIG. 2 are numbered with the same reference numerals in FIG. 2, and for brevity, explanations of these parts are omitted from the following description.

The column address pre-decoder PYDEC 5 further includes a switch circuit 55. In this embodiment, the external CPU 101 outputs CAS latency signals MDCL4 and MDCL5 instead of the pre-fetch effective signal MD2BP of the first embodiment shown in FIGS. 1 and 2. When the CAS latency signal MDCL4 has an active level (e.g., "1"), the CAS latency is four. When the CAS latency signal MDCL5 has an active level (e.g., "1"), the CAS latency is five.

The switch circuit 55 includes a NOR circuit 551 for receiving the CAS latency signals MDCL4 and MDCL5, and an inverter 552.

The circuit shown in FIG. 6 operates the same way when the CAS latency signal MDCL4 or MDCL5 has an active level as when the pre-fetch effective signal MD2BP has an active level, by using the switch circuit 55. Further, the circuit shown in FIG. 6 operates the same way when both the CAS latency signals MDCL4 and MDCL5 have an inactive level as when the pre-fetch effective signal MD2BP has an inactive level, by using the switch circuit 55.

Therefore, when the CAS latency is four or five (e.g., a large CAS latency), the system 100 is operated with the pre-fetch mode automatically. This is a key advantage over the system of the first embodiment.

As mentioned above, the synchronous DRAM system 100, which has "2" as an exemplary pre-fetch number, is explained. However, a structure for another pre-fetch number (e.g., more than 2) can be designed easily by those ordinarily skilled in the art. Moreover, the CAS latency of 4 or 5 in the second embodiment is selectively and easily changeable according to the system design.

Further, a plurality of memory cell arrays (e.g., more than 2) may be provided easily by using "bank method", although only two memory cell arrays are included in the explanation above.

While the invention has been described in terms of several preferred embodiments, those skilled in the art will recognize that the invention can be practiced with modification within the spirit and scope of the appended claims.

Having thus described my invention, what I claim as new and desire to secure by Letters Patent is as follows:

1. A synchronous dynamic random access memory (DRAM) system, comprising:

first and second DRAM cell arrays; and a first address generator for outputting a first address and a second address respectively to said first and second DRAM cell arrays simultaneously in a first mode, and for outputting said first address and said second address respectively to said first and second DRAM cell arrays sequentially in a second mode, said first mode and said second mode depending upon a type of central processing unit (CPU) being provided externally to said DRAM system for operating said DRAM system.

2. A synchronous dynamic random access memory (DRAM) system, comprising:

first and second DRAM cell arrays; and a first address generator for outputting a first address and a second address respectively to said first and second DRAM cell arrays simultaneously in a first mode, and for outputting said first address and said second address respectively to said first and second DRAM cell arrays sequentially in a second mode; and a second address generator for receiving a third address and a clock signal, for generating a next address of said third address when said clock signal is received in said second mode and outputting said next address, and for generating a fourth address having a difference of a first predetermined number between said third address and said fourth address when said first predetermined number of said clock signal is received in said first mode and outputting said fourth address, wherein said first address generator generates said first address and said second address based on said output of said second address generator.

3. The system as recited in claim 2, further comprising:

a command decoder for judging a command and for outputting a first signal to said second address generator when said command is associated with one of a reading operation and a writing operation, wherein said second address generator receives said third address when said first signal is outputted from said command decoder.

4. The system as recited in claim 3, further comprising:

a counter for initializing a content of said counter and outputting a second signal when said first signal is outputted from said command decoder, for counting said clock signal until a second predetermined number, and for stopping outputting said second signal when said content becomes said second predetermined number, wherein said second address generator is activated when said second signal is outputted from said counter.

5. The system as recited in claim 4, wherein said command decoder outputs a writing signal when said command is associated with said writing operation, and outputs a reading signal when said command is associated with said reading operation.

6. The system as recited in claim 5, further comprising:

an input buffer coupled to said first and second DRAM cell arrays;

an output buffer coupled to said first and second DRAM cell arrays; and a buffer controller for activating said input buffer while said second signal is outputted and when said writing signal is outputted, and for activating said output buffer while said second signal is outputted and when said reading signal is outputted.

7. The system as recited in claim 6, wherein said output buffer receives a first data corresponding to said first address from said first DRAM cell array and a second data corresponding to said second address from said second DRAM cell array in parallel in said first mode, converts said first and said second data to a first serial data, and outputs said first serial data.

8. The system as recited in claim 7, wherein said input buffer receives a second serial data, converts said second serial data to a third and a fourth data, and outputs said third and said fourth data respectively to said first DRAM cell array and said second DRAM cell array as a parallel data.

9. The system as recited in claim 8, wherein said system is formed on a single semiconductor chip.

10. A synchronous dynamic random access memory (DRAM) system, comprising:

first and second DRAM cell arrays; and an address generator for outputting a first address and a second address respectively to said first and second DRAM cell arrays simultaneously in a first mode, and for outputting said first address and said second address respectively to said first and second DRAM cell arrays sequentially in a second mode, said first mode and said second mode depending upon a type of central processing unit (CPU) being provided externally to said DRAM system for operating said DRAM system, wherein said system is formed on a single semiconductor chip.

11. The system as recited in claim 9, wherein said system is operated by an off-chip central processing unit (CPU).

12. The system as recited in claim 10, wherein said system is operated by an off-chip central processing unit (CPU).

13. The system as recited in claim 11, wherein said system is operated in said first mode when said off-chip CPU outputs a mode signal, and said system is operated in said second mode when said off-chip CPU does not output said mode signal.

14. The system as recited in claim 12, wherein said system is operated in said first mode when said off-chip CPU outputs a mode signal, and said system is operated in said second mode when said off-chip CPU does not output said mode signal.

15. The system as recited in claim 13, wherein said off-chip CPU outputs said mode signal when said system is operated with a predetermined column address strobe (CAS) latency.

16. The system as recited in claim 14, wherein said off-chip CPU outputs said mode signal when said system is operated with a predetermined column address strobe (CAS) latency.

17. A decoder for a synchronous dynamic random access memory (DRAM) system, comprising:

a first address generator for outputting a first address and a second address simultaneously in a first mode, and for outputting said first address and said second address sequentially in a second mode, said first mode and said second mode depending upon a type of central processing unit (CPU) being provided externally to said DRAM system for operating said DRAM system.

18. A decoder, comprising:

a first address generator for outputting a first address and a second address simultaneously in a first mode, and for outputting said first address and said second address sequentially in a second mode; and a second address generator for receiving a third address and a clock signal, for generating a next address of said third address when said clock signal is received in said second mode and outputting said next address, and for generating a fourth address having a difference of a first predetermined number between said third address and said fourth address when said first predetermined number of said clock signal is received in said first mode and outputting said fourth address, wherein said first address generator generates said first address and said second address by using said output of said second address generator.

19. The system as recited in claim 1, wherein said system is operated in said first mode when said CPU outputs a mode signal, and said system is operated in said second mode when said CPU does not output said mode signal, said CPU outputting said mode signal when said system is operated with a predetermined column address strobe (CAS) latency.

20. The decoder as recited in claim 17, wherein said DRAM system is operated in said first mode when said CPU outputs a mode signal, and said DRAM system is operated in said second mode when said CPU does not output said mode signal, said CPU outputting said mode signal when said DRAM system is operated with a predetermined column address strobe (CAS) latency.

* * * * *